(12) United States Patent
Hagelin et al.

(10) Patent No.: US 11,869,870 B1
(45) Date of Patent: Jan. 9, 2024

(54) BONDING PROCESS WITH INHIBITED OXIDE FORMATION

(71) Applicant: SiTime Corporation, Santa Clara, CA (US)

(72) Inventors: Paul M. Hagelin, Saratoga, CA (US); Charles I. Grosjean, Los Gatos, CA (US)

(73) Assignee: SiTime Corporation, Santa Clara, CA (US)

( * ) Notice: Subject to any disclaimer, the term of this patent is extended or adjusted under 35 U.S.C. 154(b) by 0 days.

(21) Appl. No.: 17/953,697

(22) Filed: Sep. 27, 2022

Related U.S. Application Data

(62) Division of application No. 17/138,255, filed on Dec. 30, 2020, now Pat. No. 11,488,930, which is a (Continued)

(51) Int. Cl.
*H01L 23/00* (2006.01)
*H01L 25/00* (2006.01)

(52) U.S. Cl.
CPC .............. *H01L 24/83* (2013.01); *H01L 24/03* (2013.01); *H01L 24/05* (2013.01); *H01L 24/80* (2013.01); *H01L 25/50* (2013.01); *H01L 2224/0346* (2013.01); *H01L 2224/0381* (2013.01); *H01L 2224/03826* (2013.01); *H01L 2224/056* (2013.01); *H01L 2224/05124* (2013.01); *H01L 2224/05609* (2013.01); *H01L 2224/05611* (2013.01); *H01L 2224/05618* (2013.01); *H01L 2224/05639* (2013.01); *H01L 2224/05644* (2013.01); *H01L 2224/05655* (2013.01); *H01L 2224/05664* (2013.01); *H01L 2224/05666* (2013.01); *H01L 2224/05669* (2013.01); *H01L 2224/05673* (2013.01); *H01L 2224/05676* (2013.01); *H01L 2224/05678* (2013.01); *H01L 2224/05683* (2013.01); *H01L 2224/08148* (2013.01); *H01L 2224/80048* (2013.01); *H01L 2224/80097* (2013.01); *H01L 2224/80805* (2013.01); *H01L 2224/83048* (2013.01); *H01L 2224/83143* (2013.01); *H01L 2224/83355* (2013.01); *H01L 2224/83895* (2013.01);

(Continued)

(58) Field of Classification Search
CPC .......... H01L 24/83; H01L 24/03; H01L 24/05
See application file for complete search history.

(56) References Cited

U.S. PATENT DOCUMENTS 3,728,090 A 4/1973 Hoffman et al.
5,083,466 A 1/1992 Holm-Kennedy et al.
(Continued)

*Primary Examiner* — Errol V Fernandes

(57) ABSTRACT

First and second contacts are formed on first and second wafers from disparate first and second conductive materials, at least one of which is subject to surface oxidation when exposed to air. A layer of oxide-inhibiting material is disposed over a bonding surface of the first contact and the first and second wafers are positioned relative to one another such that a bonding surface of the second contact is in physical contact with the layer of oxide-inhibiting material. Thereafter, the first and second contacts and the layer of oxide-inhibiting material are heated to a temperature that renders the first and second contacts and the layer of oxide-inhibiting material to liquid phases such that at least the first and second contacts alloy into a eutectic bond.

22 Claims, 1 Drawing Sheet

Related U.S. Application Data division of application No. 16/702,783, filed on Dec. 4, 2019, now Pat. No. 10,910,341, which is a division of application No. 16/222,939, filed on Dec. 17, 2018, now Pat. No. 10,541,224, which is a division of application No. 15/709,371, filed on Sep. 19, 2017, now Pat. No. 10,192,850.

(60) Provisional application No. 62/396,817, filed on Sep. 19, 2016.

(52) U.S. Cl.
CPC . *H01L 2224/83911* (2013.01); *H01L 2224/94* (2013.01); *H01L 2225/06513* (2013.01); *H01L 2924/01047* (2013.01); *H01L 2924/01079* (2013.01); *H01L 2924/10252* (2013.01); *H01L 2924/10253* (2013.01); *H01L 2924/10271* (2013.01); *H01L 2924/1461* (2013.01)

(56) References Cited

U.S. PATENT DOCUMENTS

| | | | |
|---|---|---|---|
| 5,249,732 | A | 10/1993 | Thomas |
| 5,359,893 | A | 11/1994 | Dunn |
| 5,367,194 | A | 11/1994 | Beatty |
| 5,426,070 | A | 6/1995 | Shaw et al. |
| 5,481,914 | A | 1/1996 | Ward |
| 5,485,032 | A | 1/1996 | Schepis et al. |
| 5,604,312 | A | 2/1997 | Lutz |
| 5,656,778 | A | 8/1997 | Roszhart |
| 5,659,195 | A | 8/1997 | Kaiser et al. |
| 5,693,574 | A | 12/1997 | Schuster et al. |
| 5,703,293 | A | 12/1997 | Zabler et al. |
| 5,728,936 | A | 3/1998 | Lutz |
| 5,780,740 | A | 7/1998 | Lee et al. |
| 5,889,207 | A | 3/1999 | Lutz |
| 5,895,850 | A | 4/1999 | Buestgens |
| 5,915,168 | A | 6/1999 | Salatino et al. |
| 5,992,233 | A | 11/1999 | Clark |
| 5,996,409 | A | 12/1999 | Funk et al. |
| 6,036,872 | A | 3/2000 | Wood et al. |
| 6,122,961 | A | 9/2000 | Geen et al. |
| 6,128,961 | A | 10/2000 | Haronian |
| 6,153,917 | A | 11/2000 | Matsunaga et al. |
| 6,189,381 | B1 | 2/2001 | Huang et al. |
| 6,199,748 | B1 | 3/2001 | Zhu et al. |
| 6,229,190 | B1 | 5/2001 | Bryzek et al. |
| 6,250,157 | B1 | 6/2001 | Touge |
| 6,391,673 | B1 | 5/2002 | Ha et al. |
| 6,426,687 | B1 | 7/2002 | Osborn |
| 6,430,998 | B2 | 8/2002 | Kawai et al. |
| 6,433,411 | B1 | 8/2002 | Degani et al. |
| 6,448,109 | B1 | 9/2002 | Karpman |
| 6,452,238 | B1 | 9/2002 | Orcutt et al. |
| 6,479,320 | B1 | 11/2002 | Gooch |
| 6,480,320 | B2 | 11/2002 | Nasiri |
| 6,481,283 | B1 | 11/2002 | Cardarelli |
| 6,481,284 | B2 | 11/2002 | Geen et al. |
| 6,481,285 | B1 | 11/2002 | Shkel et al. |
| 6,487,908 | B2 | 12/2002 | Geen et al. |
| 6,508,122 | B1 | 1/2003 | McCall et al. |
| 6,513,380 | B2 | 2/2003 | Reeds et al. |
| 6,519,075 | B2 | 2/2003 | Carr et al. |
| 6,528,344 | B2 | 3/2003 | Kang |
| 6,528,887 | B2 | 3/2003 | Daneman et al. |
| 6,533,947 | B2 | 3/2003 | Nasiri et al. |
| 6,555,417 | B2 | 4/2003 | Spooner et al. |
| 6,559,530 | B2 | 5/2003 | Hinzel et al. |
| 6,621,137 | B1 | 9/2003 | Ma et al. |
| 6,635,509 | B1 | 10/2003 | Ouellet |
| 6,650,455 | B2 | 11/2003 | Miles |
| 6,660,564 | B2 | 12/2003 | Brady |
| 6,686,639 | B1 | 2/2004 | Tsai |
| 6,770,569 | B2 | 8/2004 | Foerstner et al. |
| 6,794,272 | B2 | 9/2004 | Turner et al. |
| 6,796,178 | B2 | 9/2004 | Jeong et al. |
| 6,808,955 | B2 | 10/2004 | Ma |
| 6,852,926 | B2 | 2/2005 | Ma et al. |
| 6,892,575 | B2 | 5/2005 | Nasiri et al. |
| 6,918,297 | B2 | 7/2005 | MacGugan |
| 6,936,491 | B2 | 8/2005 | Partridge et al. |
| 6,936,494 | B2 | 8/2005 | Cheung |
| 6,939,473 | B2 | 9/2005 | Nasiri et al. |
| 6,943,484 | B2 | 9/2005 | Clark et al. |
| 7,004,025 | B2 | 2/2006 | Tamura |
| 7,028,547 | B2 | 4/2006 | Shiratori et al. |
| 7,104,129 | B2 | 9/2006 | Nasiri et al. |
| 7,196,404 | B2 | 3/2007 | Schirmer et al. |
| 7,247,246 | B2 | 7/2007 | Nasiri et al. |
| 7,642,692 | B1 | 1/2010 | Pulskamp |
| 7,907,838 | B2 | 3/2011 | Nasiri et al. |
| 8,022,554 | B2 | 9/2011 | Gupta et al. |
| 8,220,330 | B2 | 7/2012 | Miller et al. |
| 8,234,774 | B2 | 8/2012 | Hagelin et al. |
| 8,236,577 | B1 | 8/2012 | Hsu et al. |
| 8,871,551 | B2 | 10/2014 | Partridge et al. |
| 10,192,850 | B1 | 1/2019 | Tagelin et al. |
| 10,541,224 | B1 | 1/2020 | Hagelin et al. |
| 10,910,341 | B1 | 2/2021 | Hagelin et al. |
| 2001/0001931 | A1 | 5/2001 | Fujii et al. |
| 2001/0006248 | A1 | 7/2001 | Allen et al. |
| 2001/0009110 | A1 | 7/2001 | Tmai |
| 2001/0034076 | A1 | 10/2001 | Martin |
| 2002/0016058 | A1 | 2/2002 | Zhao |
| 2002/0043706 | A1 | 4/2002 | Jerominek et al. |
| 2002/0051258 | A1 | 5/2002 | Tamura |
| 2002/0117728 | A1 | 8/2002 | Brosnihhan et al. |
| 2002/0132062 | A1 | 9/2002 | Jacobs |
| 2002/0135047 | A1 | 9/2002 | Funk et al. |
| 2002/0179126 | A1 | 12/2002 | DeYoung et al. |
| 2002/0197002 | A1 | 12/2002 | Lin |
| 2003/0002019 | A1 | 1/2003 | Miller |
| 2003/0016337 | A1 | 1/2003 | Duncan et al. |
| 2003/0038327 | A1 | 2/2003 | Smith |
| 2003/0054588 | A1 | 3/2003 | Patel et al. |
| 2003/0074967 | A1 | 4/2003 | Tang et al. |
| 2003/0110858 | A1 | 6/2003 | Kim et al. |
| 2003/0141561 | A1 | 7/2003 | Fischer et al. |
| 2003/0146464 | A1 | 8/2003 | Prophet |
| 2003/0155643 | A1 | 8/2003 | Freidhoff |
| 2003/0161949 | A1 | 8/2003 | Ashurst et al. |
| 2003/0164041 | A1 | 9/2003 | Jeong et al. |
| 2003/0178635 | A1 | 9/2003 | Volant et al. |
| 2003/0183916 | A1 | 10/2003 | Heck et al. |
| 2003/0215974 | A1 | 11/2003 | Kawasaki et al. |
| 2004/0016989 | A1 | 1/2004 | Ma et al. |
| 2004/0055380 | A1 | 3/2004 | Shcheglov et al. |
| 2004/0065932 | A1 | 4/2004 | Reichenbach et al. |
| 2004/0106294 | A1 | 6/2004 | Lee et al. |
| 2004/0183214 | A1 | 9/2004 | Partridge et al. |
| 2004/0248344 | A1 | 12/2004 | Partridge et al. |
| 2005/0081633 | A1 | 4/2005 | Nasiri et al. |
| 2005/0101059 | A1 | 5/2005 | Yang |
| 2005/0156260 | A1 | 7/2005 | Partridge et al. |
| 2005/0170656 | A1 | 8/2005 | Nasiri et al. |
| 2005/0195050 | A1 | 9/2005 | Lutz et al. |
| 2005/0253206 | A1 | 11/2005 | Bureau et al. |
| 2005/0260828 | A1 | 11/2005 | Yuasa |
| 2005/0262929 | A1 | 12/2005 | Felton et al. |
| 2005/0285172 | A1 | 12/2005 | Freeman et al. |
| 2006/0246631 | A1 | 11/2006 | Lutz et al. |
| 2008/0116534 | A1 | 5/2008 | Grosjean et al. |
| 2008/0283990 | A1 | 11/2008 | Nasiri et al. |
| 2011/0049694 | A1* | 3/2011 | Chandrasekaran ..... H01L 24/83 438/109 |
| 2012/0248615 | A1 | 10/2012 | Chien et al. |
| 2012/0326248 | A1 | 12/2012 | Daneman et al. |
| 2013/0168852 | A1 | 7/2013 | Liang et al. |
| 2015/0099316 | A1 | 4/2015 | Ryu et al. |
| 2016/0002029 | A1 | 1/2016 | Nasiri et al. |
| 2017/0355593 | A1 | 12/2017 | Huang et al. |

\* cited by examiner

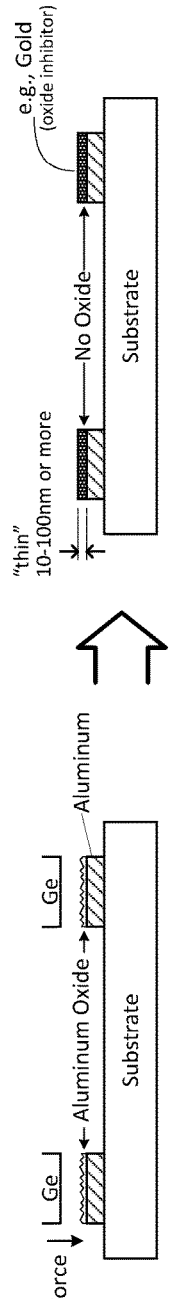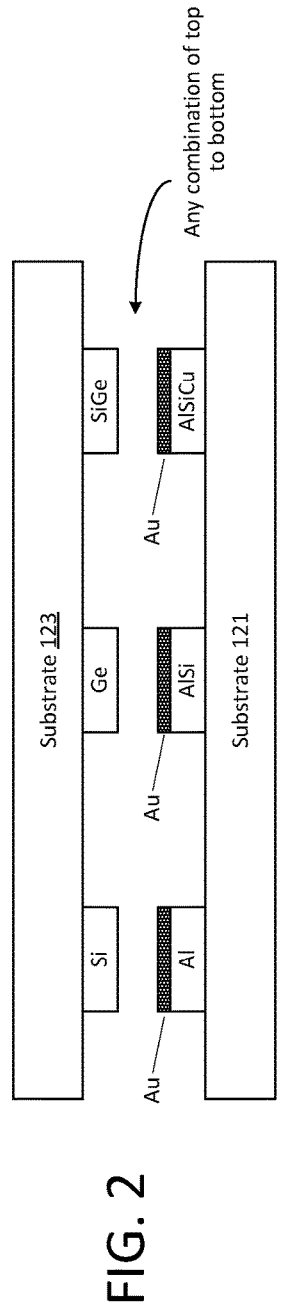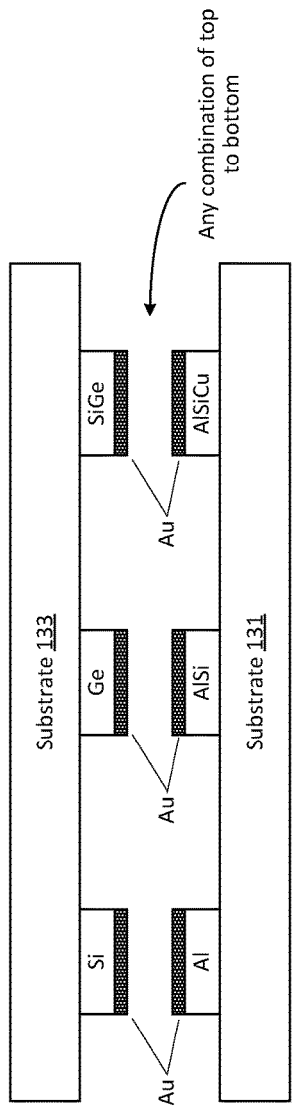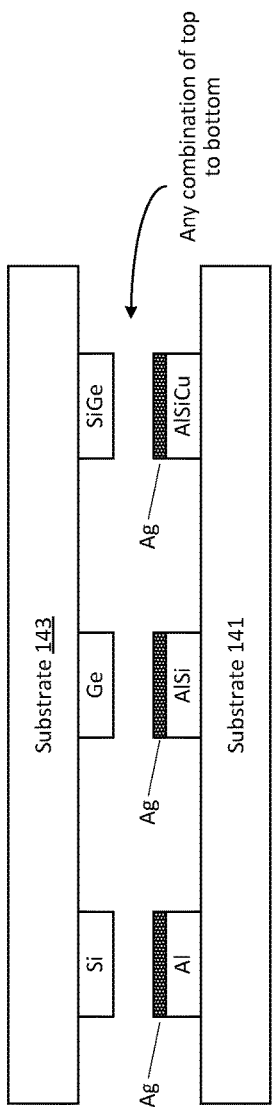

BONDING PROCESS WITH INHIBITED OXIDE FORMATION

PRIORITY, CROSS-REFERENCES, INCORPORATION BY REFERENCE

This application is a divisional of U.S. patent application Ser. No. 17/138,255, filed Dec. 30, 2020, which is a divisional of U.S. patent application Ser. No. 16/702,783, filed Dec. 4, 2019 (now U.S. patent Ser. No. 10/910,341), which is a divisional of U.S. patent application Ser. No. 16/222,939 filed Dec. 17, 2018 (now U.S. patent Ser. No. 10/541,224), which is a divisional of U.S. patent application Ser. No. 15/709,371 filed Sep. 19, 2017 (now U.S. patent Ser. No. 10/192,850), which claims priority to U.S. Provisional Patent Application No. 62/396,817 filed Sep. 19, 2016. Each of the above-identified applications is hereby incorporated by reference.

TECHNICAL FIELD

The present disclosure relates to semiconductor wafer-to-wafer, die-to-wafer and die-to-die bonding.

BACKGROUND

In a solder system containing aluminum on one side, as in the case of a CMOS wafer, the problem exists of rapid native oxidation of the aluminum surface—forming an oxide layer that can impede solder bonding generally, and wafer-to-wafer bonding in particular. Common methods used to combat the oxide formation include pre-bond cleaning (plasma, chemical), high force during bonding (breaking the oxide), and gas treatment prior to bonding (forming gas at temperature), all of which add complexity and cost to the bonding operation.

DRAWINGS

The various embodiments disclosed herein are illustrated by way of example, and not by way of limitation, in the figures of the accompanying drawings and in which like reference numerals refer to similar elements and in which:

FIG. 1 contrasts a conventional, oxide-plagued bonding approach with an exemplary oxide-inhibited bonding technique;

FIG. 2 illustrates a variety of materials that may be used to enable oxide-inhibited bonding of counterpart substrates;

FIG. 3 illustrates the same bonding materials as FIG. 2, but with oxide-inhibitant disposed on the bonding surfaces on both counterpart substrates; and FIG. 4 illustrates the optional bonding materials of FIG. 2 (Al, AlSi, AlSiCu) disposed on counterpart substrates and capped with silver oxide inhibitant rather than the gold oxide inhibitant shown in prior drawing figures.

DETAILED DESCRIPTION

In various embodiments herein, bonding surface(s) of conductive contacts deposited or otherwise formed on a wafer or die is capped with another material to inhibit (or prevent, limit or control) the oxidation of the bonding surface. By using a capping material that does not oxidize or has an easier to remove oxide, steps commonly used to remove undesired oxide can be reduced or eliminated from the bonding process. In particular, bonding can be performed at substantially lower force which advantageously lessens relative movement of the precisely-aligned substrates during wafer bonding, flowing of the solder during liquidus, etc.

Materials that may be used for capping the aluminum layer include, for example and without limitation, the family of noble materials (e.g., rhenium, ruthenium, rhodium, palladium, silver, osmium, iridium, platinum, gold, etc. and various alloys thereof) and other materials such as copper, titanium, nickel, indium, tin, and zinc. Materials that form some oxide, but are softer than aluminum are also useful as lower force can be used to cause mechanical deformation and thereby expose un-oxidized material at the bonding surface of the contact.

In one embodiment, the capping material is deposited on the aluminum in an environment that is free of oxidation (e.g., in the same chamber, or multiple deposition chambers connected by a common vacuum chamber), or in a chemical environment such as a plating bath, etc. in which oxidation is removed as part of the process. Where oxide removal is not inherent in the inhibitant disposition process, any exposure of the bonding surface to an oxidizing environment is limited in time and/or concentration (i.e., limited concentration of oxidizing agents) such that the exposed contact surface remains primarily that of the bonding surface material (e.g., aluminum, aluminum alloy, etc.) In yet other embodiments, the substrate with aluminum or other oxidation-prone bonding surface is further processed, and then later cleaned (for example in a sputter etch) to remove the oxide before depositing the capping material (again, with limited pre-capping exposure to an oxidizing environment) to form a final structure with a layer of aluminum (including any of various aluminum alloys) and the capping material.

In practice, the capping material is chosen for compatibility with the overall requirements of the intended solder bond. For example, in the case of a binary eutectic (two materials forming a eutectic bond), the capping material may form either with the aluminum alloy, or with the complementary substrate material, or both. The resulting ternary system (or quaternary, or higher material count system) is generally chosen to melt at a reasonable/tolerable temperature in view of the system elements, and to form a stable solder joint.

FIG. 1 contrasts a conventional, oxide-plagued bonding approach (relatively high force applied to break aluminum oxide) with an exemplary oxide-inhibited bonding technique in which aluminum contacts are capped with thin gold films to inhibit oxide formation and thereby enable formation of eutectic wafer-to-wafer (or die-to-wafer or die-to-die) bonds with substantially reduced applied force.

FIG. 2 illustrates a variety of materials that may be used to enable oxide-inhibited bonding of counterpart substrates 121 and 123. As shown, aluminum (optionally alloyed with trace to significant amounts of silicon and/or copper, for example) is disposed on substrate 121 and capped with an oxide inhibitant of Gold (e.g., 10-100 nm thick, though thicker or thinner films may be used), while silicon, germanium, or an alloy of both (SiGe) is disposed on the counterpart substrate 123. Any of the bonding materials on substrate 121 may be bonded with any of the bonding materials on substrate 123 to form a bond within a given system, and a diversity of bond types may exist within the same system. Substrates 121 and 123 may themselves be different wafers (e.g., two different CMOS wafers, a CMOS wafer and a microelectromechanical-system (MEMS) wafer, etc. to be singulated into individual dies after wafer-to-wafer bonding), different dies, or a die and a wafer. With respect to different wafer or die types (e.g., MEMS and CMOS), any of the bonding material pairs may be reversed in orientation from those depicted (e.g., Si/Ge/SiGe may be disposed on MEMS wafer or CMOS wafer) and a diversity of such orientations may exist within the same system. Also, either or both of substrates 121 and 123 may individually include one or more constituent substrates and/or other structural components (e.g., resonant MEMS structures, metal layers, oxide layers, vias, encapsulation chambers, etc.).

FIG. 3 illustrates the same bonding materials as FIG. 2, but with oxide-inhibitant (gold in the examples of FIGS. 2 and 3) disposed on the bonding surfaces on each of substrates 131 and 133. Thus, aluminum (or alloy) with a cap of gold is disposed on substrate 131, and silicon/germanium (one, the other, or alloy of the two) with a cap of gold is disposed on substrate 133. As in FIG. 3, any of the bonding materials on substrate 131 may be bonded with any of the bonding materials on substrate 133 to form a bond within a given system, and a diversity of bond types may exist within the same system. Also, substrates 131 and 133 may be different wafers (e.g., two different CMOS wafers, a CMOS wafer and a microelectromechanical-system (MEMS) wafer, etc. to be singulated into individual dies after wafer-to-wafer bonding), different dies, or a die and a wafer, and either or both of substrates 131 and 133 may individually include one or more constituent substrates and/or other structural components (e.g., resonant MEMS structures, vias, encapsulation chambers, etc.). With respect to different wafer or die types (e.g., MEMS and CMOS), any of the bonding material pairs may be reversed in orientation from those depicted (e.g., Si/Ge/SiGe may be disposed on MEMS wafer or CMOS wafer) and a diversity of such orientations may exist within the same system.

Despite the gold-cap oxide inhibitor shown in FIGS. 2 and 3, any of the depicted bonding surfaces/materials may be capped with oxide inhibitors other than gold. FIG. 4, for example, illustrates the bonding materials of FIG. 2 (Al, AlSi, AlSiCu) disposed on counterpart substrates 141 and 143 and capped with oxide inhibitors of silver instead of gold. The counterpart bonding surfaces may similarly be capped with silver instead of gold (i.e., arrangement shown in FIG. 3, but with silver inhibitor instead of gold).

In general, oxide-inhibited bonding processes according to the techniques shown and described herein involve substrate alignment (e.g., wafer alignment in a wafer bond, singulated die alignment in a die-to-die bond), substrate-to-substrate contact with varying degrees of force (including a force ramp), and then elevation (e.g., ramp) to at least a first temperature where particular binary combinations reach liquidus (for example, a temperature at which silicon with gold cap reaches liquidus). Depending on the choice of materials, the ternary or larger combination may reach liquidus upon elevation to the first temperature, or, if not, further elevation to a second temperature and possibly additional elevations to third, or higher temperature targets are carried out to achieve liquidus of the ternary (or quaternary, etc.) system. In embodiments having multiple different liquidus temperatures, elevation to each temperature may be accompanied by a pause of variable and/or controlled duration (i.e., plateau at a particular temperature) before commencing further elevation toward the higher temperature (plateau). In an alternative embodiment having multiple liquidus temperatures, the temperature may be raised directly to a higher than eutectic temperature which might be useful in achieving certain alloy compositions. In another embodiment, prior to substrate alignment and bonding, one or both wafers are heated to one or more predetermined temperatures to alloy the oxide-inhibiting material with the conductive material that constitutes the underlying contact. In general, heating to a single alloy-forming temperature ("alloying temperature") is sufficient where oxide-inhibitant is disposed over the bonding surfaces of only one of the counterpart wafers or where a single temperature setpoint is sufficient to alloy respective dispositions of oxide-inhibitant and underlying contacts on both of counterpart wafers. Conversely, where alloying temperatures of oxide-inhibitant and underlying contacts are substantially different with respect to counterpart wafers, each wafer may be separately heated to a respective alloying temperature. Any or all of the alloying temperatures may be higher or lower than the eutectic bonding temperature. Also, in all cases, temperature elevation for alloying or bonding purposes may be monotonic (until eventual cool down) or may be characterized by one or more valleys or inflections.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. The term "contact" herein generally refers to a conductive material that makes up part of a conductive bond, though "physical contact" refers to physical touching—a distinction generally clear from context. "Contact interface" refers to a bond interface. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An apparatus comprising:
a first die having a first electrical contact; and
a second die having a second electrical contact;
wherein the apparatus is fabricated according to a process in which an oxide-inhibiting material, disposed on a surface of one of the first electrical contact and the second electrical contact, is melted and forms a bond region between the first electrical contact and the second electrical contact, the bond region having a material constituency that is at least in part different than either the first electrical contact or the second electrical contact;
wherein:
the first electrical contact comprises one of aluminum, a mixture of aluminum-silicon, a mixture of aluminum-copper and a mixture of aluminum-silicon-copper; and
the second electrical contact comprises one of silicon, germanium, and a mixture of silicon-germanium.

2. The apparatus of claim 1 wherein the apparatus is fabricated according to a process in which the oxide-inhibiting material is disposed so as to cap a conductive surface of the first electrical contact, according to a process in which the first die is positioned so as to place the oxide-inhibiting material between the conductive surface of the first electrical contact and a conductive surface of the second electrical contact and according to a process in which the oxide-inhibiting material is then melted to form the bond region.

3. The apparatus of claim 1 wherein the oxide-inhibiting material comprises a capping layer of no more than 100 nanometers thickness prior to melting of the oxide-inhibiting material.

4. The apparatus of claim 1 wherein the bond region comprises a eutectic bond.

5. The apparatus of claim 1 wherein the oxide-inhibiting material comprises at least one of a noble material, copper, titanium, nickel, iridium, tin and zinc.

6. The apparatus of claim 1 wherein the oxide-inhibiting material comprises at least one of rhenium, ruthenium, rhodium, palladium, silver, osmium, iridium, platinum, gold and an alloy thereof.

7. The apparatus of claim 1 wherein the oxide-inhibiting material comprises at least one of gold and silver.

8. The apparatus of claim 1 wherein the apparatus is fabricated according to a process in which a first wafer bearing the first die is aligned with a second wafer bearing the second die, and in which apparatus is cut from the first die and the second die once bonded.

9. The apparatus of claim 1 wherein the apparatus is fabricated according to a process in which force is applied to urge the first electrical contact toward the second electrical contact in connection with melting of the oxide-inhibiting material.

10. The apparatus of claim 1 wherein the bond region comprises a mixture of material from the oxide inhibiting material and material from at least one of the first electrical contact and the second electrical contact.

11. An apparatus comprising:
a first die having a first electrical contact; and
a second die having a second electrical contact;
wherein the apparatus is fabricated according to a process in which an oxide-inhibiting material, disposed on a surface of one of the first electrical contact and the second electrical contact, is melted and forms a bond region between the first electrical contact and the second electrical contact, the bond region having a material constituency that is at least in part different than either the first electrical contact or the second electrical contact;
wherein the first electrical contact comprises one of aluminum, a mixture of aluminum-silicon, a mixture of aluminum-copper and a mixture of aluminum-silicon-copper;
wherein the second electrical contact comprises one of silicon, germanium, and a mixture of silicon-germanium; and
wherein a first one of the first die and the second die comprises a microelectromechanical system (MEMS) structure and a second one of the first die and the second die comprises a complementary metal-oxide-semiconductor (CMOS) structure.

12. The apparatus of claim 11 wherein the first electrical contact comprises aluminum and wherein the first die comprises the CMOS structure.

13. The apparatus of claim 11 wherein the apparatus is fabricated according to a process in which the oxide-inhibiting material is disposed so as to cap a conductive surface of the first electrical contact, according to a process in which the first die is positioned so as to place the oxide-inhibiting material between the conductive surface of the first electrical contact and a conductive surface of the second electrical contact and according to a process in which the oxide-inhibiting material is then melted to form the bond region.

14. The apparatus of claim 11 wherein the oxide-inhibiting material comprises a capping layer of no more than 100 nanometers thickness prior to melting of the oxide-inhibiting material.

15. The apparatus of claim 14 wherein the bond region comprises a eutectic bond, and wherein the capping layer comprises at least one of rhenium, ruthenium, rhodium, palladium, silver, osmium, iridium, platinum, gold and an alloy thereof.

16. The apparatus of claim 14 wherein the capping layer comprises at least one of gold and silver.

17. The apparatus of claim 11 wherein the apparatus is fabricated according to a process in which a first wafer bearing the first die is aligned with a second wafer bearing the second die, and in which apparatus is cut from the first die and the second die once bonded.

18. The apparatus of claim 11 wherein the apparatus is fabricated according to a process in which force is applied to urge the first electrical contact toward the second electrical contact in connection with melting of the oxide-inhibiting material.

19. The apparatus of claim 11 wherein the bond region comprises a mixture of material from the oxide inhibiting material and material from at least one of the first electrical contact and the second electrical contact.

20. An apparatus comprising:
a complementary metal-oxide-semiconductor (CMOS) die having a first electrical contact; and
a microelectromechanical systems (MEMS) die having a second electrical contact;
wherein the first electrical contact comprises one of aluminum, a mixture of aluminum-silicon, a mixture of aluminum-copper, and a mixture of aluminum-silicon-copper; and
wherein the second electrical contact comprises one of silicon, germanium, and a mixture of silicon-germanium; and
wherein the apparatus is fabricated according to a process in which an oxide-inhibiting material disposed on a surface of one of the first electrical contact and the second electrical contact is melted to form a bond region between the first electrical contact and the second electrical contact, the bond region having a material constituency that is at least in part different than either the first electrical contact or the second electrical contact.

21. The apparatus of claim 20 wherein the bond region corresponds to a eutectic bond and wherein the oxide-inhibiting material comprises at least one of rhenium, ruthenium, rhodium, palladium, silver, osmium, iridium, platinum, gold and an alloy thereof.

22. The apparatus of claim 20 wherein the apparatus is fabricated according to a process in which a first wafer bearing the first die is aligned with a second wafer bearing the second die, and in which apparatus is cut from the first die and the second die once bonded.

* * * * *